(12) United States Patent
Su et al.

(10) Patent No.: US 7,985,003 B2
(45) Date of Patent: Jul. 26, 2011

(54) LIGHT-EMITTING MEMBER AND ITS FORMING MOLD

(75) Inventors: Wen-Lung Su, Hsin-Chu Hsein (TW); Chin-Chang Hsu, Hsin-Chu Hsein (TW); Hsuan-Chi Liu, Hsin-Chu Hsein (TW)

(73) Assignee: Lextar Electronics Corp., Hsinchu (TW)

( * ) Notice: Subject to any disclaimer, the term of this patent is extended or adjusted under 35 U.S.C. 154(b) by 0 days.

(21) Appl. No.: 12/197,723

(22) Filed: Aug. 25, 2008

(65) Prior Publication Data

US 2010/0188861 A1    Jul. 29, 2010

(30) Foreign Application Priority Data

Jun. 19, 2008 (TW) .................................. 097122951

(51) Int. Cl.
*F21S 4/00* (2006.01)
*F21V 21/00* (2006.01)

(52) U.S. Cl. .................. 362/249.02; 425/115; 425/127; 425/129.1; 425/116; 362/646; 362/800

(58) Field of Classification Search .................. 362/800, 362/282, 249.01, 249.02, 646, 97.3, 382, 362/84, 184, 249, 16, 249.16, 249.18, 249.17, 362/653, 654; 249/187.1, 120, 134–136, 249/140, 144, 155, 159, 165; 257/99, 100; 425/116, 169, 173, 115, 127, 129.1
See application file for complete search history.

(56) References Cited

U.S. PATENT DOCUMENTS

| | | | | | |
|---|---|---|---|---|---|
| 4,980,568 | A | * | 12/1990 | Merrick et al. | 250/551 |
| 5,952,018 | A | * | 9/1999 | Beldue et al. | 425/556 |
| 6,139,304 | A | * | 10/2000 | Centofante | 425/121 |
| 6,573,580 | B2 | * | 6/2003 | Arndt | 257/433 |
| 6,682,331 | B1 | * | 1/2004 | Peh et al. | 425/112 |
| 6,943,433 | B2 | * | 9/2005 | Kamada | 257/666 |
| 2004/0000867 | A1 | * | 1/2004 | Chen | 313/512 |
| 2004/0046242 | A1 | * | 3/2004 | Asakawa | 257/678 |
| 2004/0135504 | A1 | * | 7/2004 | Tamaki et al. | 313/512 |

\* cited by examiner

*Primary Examiner* — Sharon E Payne
*Assistant Examiner* — Danielle Allen
(74) *Attorney, Agent, or Firm* — Liu & Liu

(57) ABSTRACT

A forming mold of a light-emitting member includes a frame, an upper mold and a lower mold, and the frame is provided with carriers, pins and supporting portions. The upper and lower molds match with each other to provide a forming space for the base of the light-emitting member. The forming space contains the carriers and a part of the supporting portions. One or more projections are disposed at the position where the brinks of the upper and lower molds contact the supporting portions. After injection molding, the burrs formed by a plastic material along the supporting portions can be concealed in the recesses that are formed corresponding to each of the projections, thereby reducing the influence of the burrs on the external size of the base.

16 Claims, 13 Drawing Sheets

LIGHT-EMITTING MEMBER AND ITS FORMING MOLD

BACKGROUND OF THE INVENTION (a) Field of the Invention

The present invention relates to a light-emitting member and its forming mold, and more particularly to a light-emitting member capable of reducing the influence of the burrs on the external size of the entire base and its forming mold.

(b) Description of the Prior Art

Due to the properties such as compact size, low power consumption, low emission of heat, long lifetime, and the like of light-emitting components, they have been gradually used to substitute traditional tungsten filament lamps with similar functions in commercial products such as Christmas lights, torch lights, signal lights for vehicles, traffic signs, etc. Furthermore, the fundamental construction of a general light-emitting component comprises electrically conducting terminals with different polarities and a carrier disposed within a transparent package, wherein a die is fixedly disposed on the carrier, connections through gold wires are provided between the electrode layers of the die and the electrically conducting terminals, and each of the electrically conducting terminals are extended out of the transparent package to form power contacts.

The light source generated by the die causes the light-emitting effect under the condition that the electrically conducting terminals are energized. It is understood that a fluorescent material can be disposed at the periphery of the die. When the light source generated by the die passes through the fluorescent material, it is combined with the wavelength excited by the fluorescent material to produce a desired color light. Therefore, in comparison with the fixed specifications for traditional light sources, highly customized light-emitting components can be manufactured by means of the material design and formulation with the improvement of the related manufacturing processes and technology, thereby further soon expanding the market of light-emitting components.

As illustrated in FIGS. 1 and 2, there are a plan view and a side view of a semi-finished frame of a general conventional light-emitting diode. Wherein the frame 10 is made by stamping a flat metal strip to form two carriers 12 which are corresponding to each other but whose corresponding ends are not connected with each other in a stamping operation. Next, a plastic body 13 is formed in the region between the two carriers 12 during an injection operation, followed by stamping the section of the carriers 12 that protrudes out of the plastic body 13 into the section of pins 14 of a given shape in a stamping operation. Then, the section of pins 14 is bent towards the given position with respect to the plastic body 13 through at least one stamping action to form a complete structure of the pins 14. Accordingly, the finishing process of an entire frame is completed so as to obtain a frame structure for a light-emitting diode in which light-emitting dies are fixedly disposed on the carriers 12 and a related fluorescent material or a related packaging material is filled into the plastic body 13.

In general, for the purpose of ensuring that the plastic body 13 does not deviate during the finishing process, the frame 10 can be further formed with supporting portions 15 for fastening the plastic body, as illustrated in FIGS. 1 and 3. The supporting portions 15 are not connected with the carriers 12. When injection molding is performed, the upper and lower molds 161, 162 match with each other, as illustrated in FIG. 4, between which a forming space 163 for the plastic body is provided. The supporting portions 15 are located between the upper and lower molds 161, 162. When a plastic material is injected is into the forming space 163, the plastic material may bleed along the contact surfaces between the brinks of the forming space 163 and the supporting portions 15 to form burrs 17, as illustrated in FIGS. 2 and 5. The burrs 17 would cause errors in the overall dimensions after the plastic body is formed such that the light-emitting diode performs poorly and easily deviates from its original position when in use.

SUMMARY OF THE INVENTION

In view of the above-mentioned circumstances, the primary objective of the present invention is to provide a light-emitting member capable of reducing the influence of the burrs on the external size of the entire base and its forming mold.

To achieve the above objective, a forming mold of a light-emitting member according to the present invention at least comprises: a frame, an upper mold and a lower mold, and the frame is provided with carriers, pins and supporting portions. The upper and lower molds match with each other to provide a forming space for the base of the light-emitting member. The forming space contains the carriers and a part of the supporting portions. One or more projections are disposed at the position where the brinks of the upper and lower molds contact the supporting portions. After injection molding, the burrs formed by injection fluid along the supporting portions can be concealed in the recesses that are formed corresponding to each of the projections, thereby reducing the influence of the burrs on the external size of the entire base.

DETAILED DESCRIPTION OF THE PREFERRED EMBODIMENTS

Figure 1:
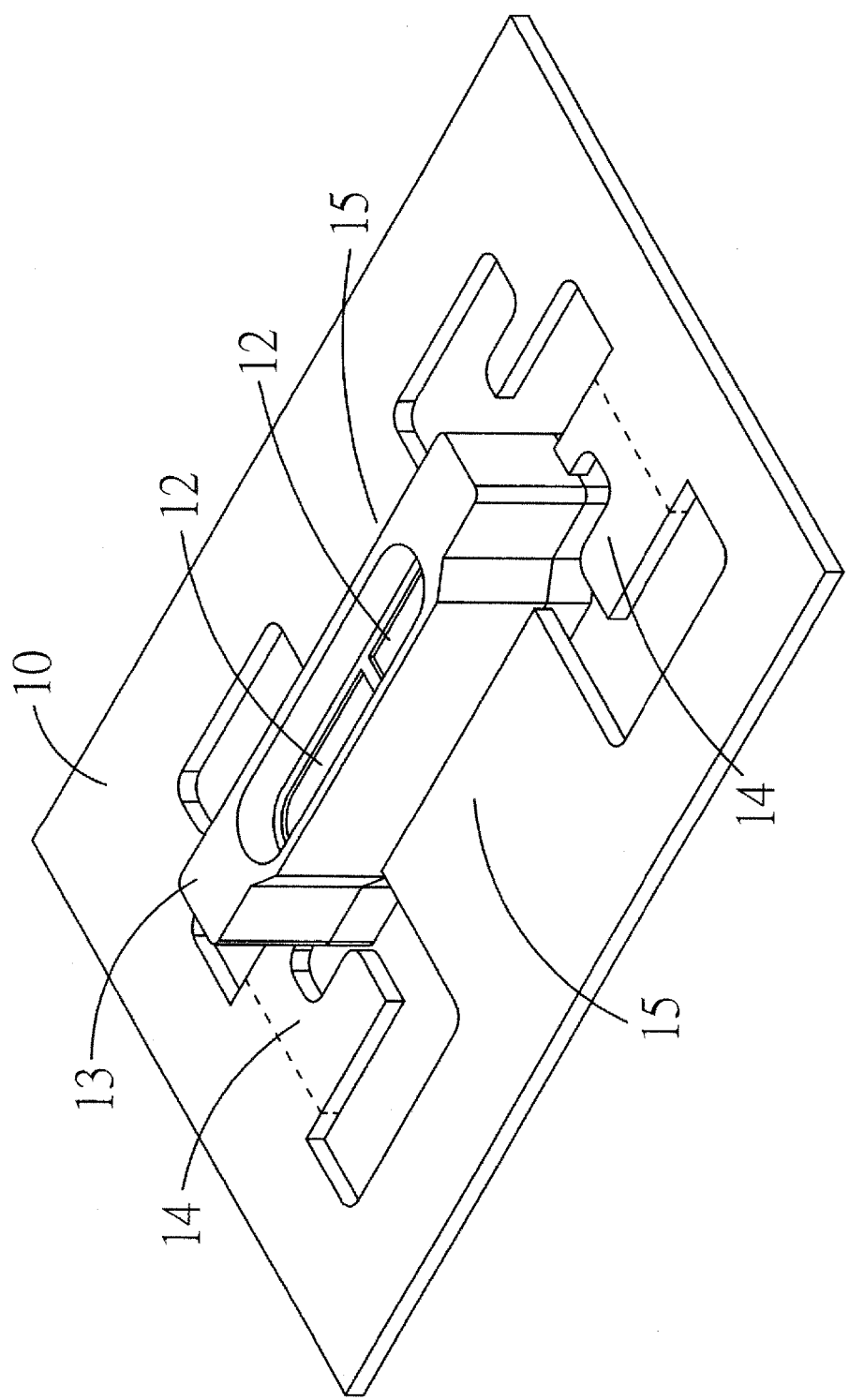
FIG. 1 is a three-dimensional view showing a structure of a conventional light-emitting component.
Figure 2:
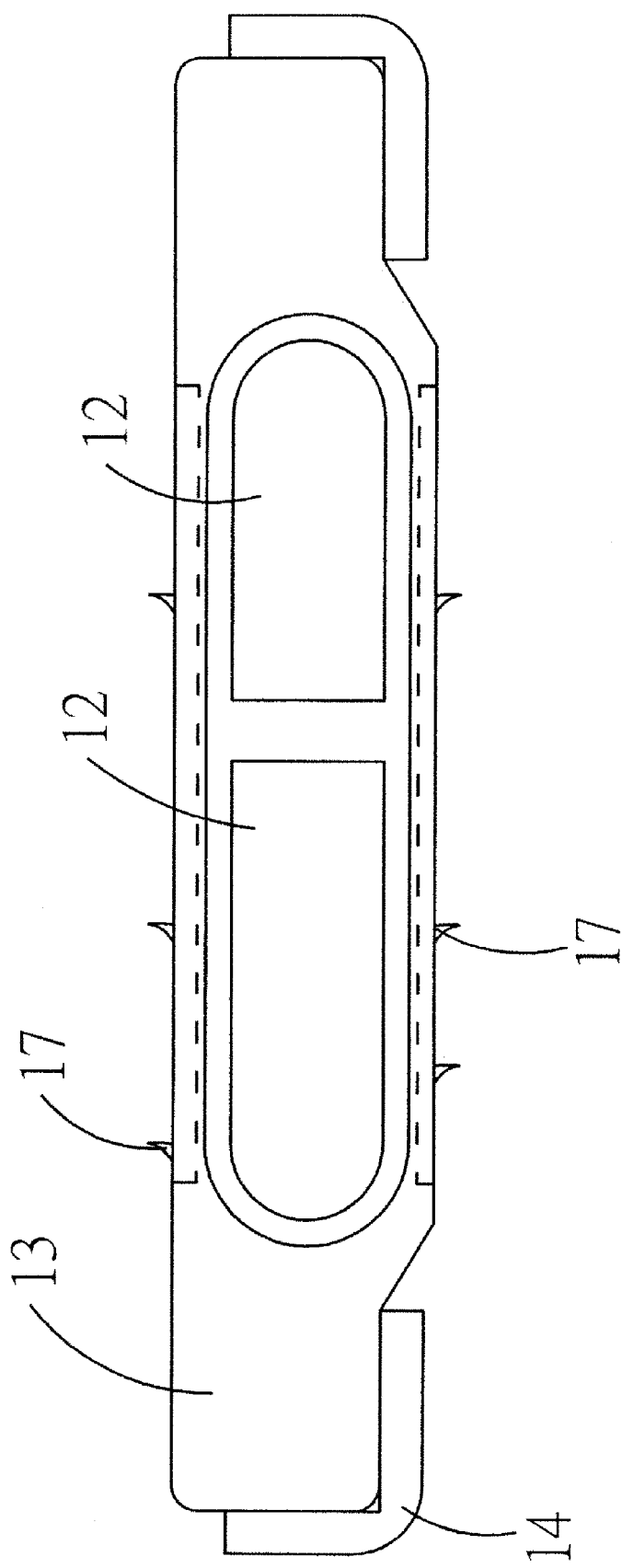
FIG. 2 is a schematic view showing a structure of a conventional light-emitting component.
Figure 3:
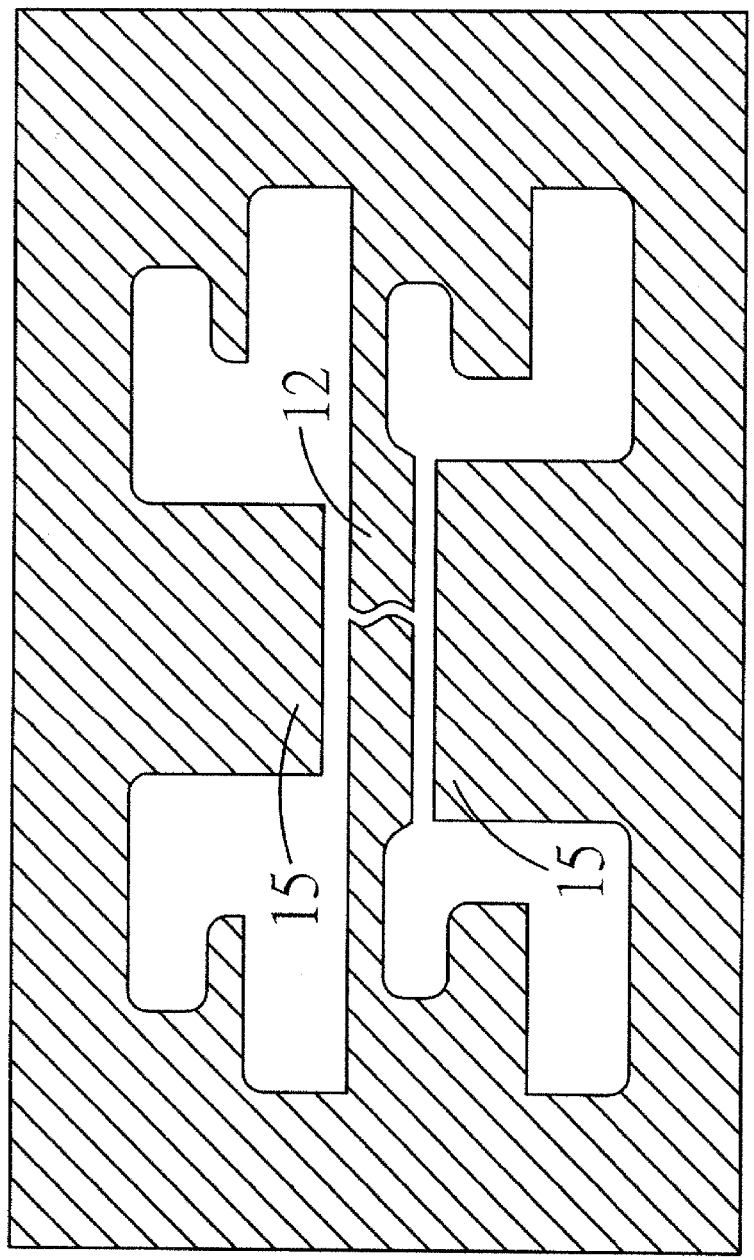
FIG. 3 is a schematic view showing a structure of a general frame.
Figure 4:
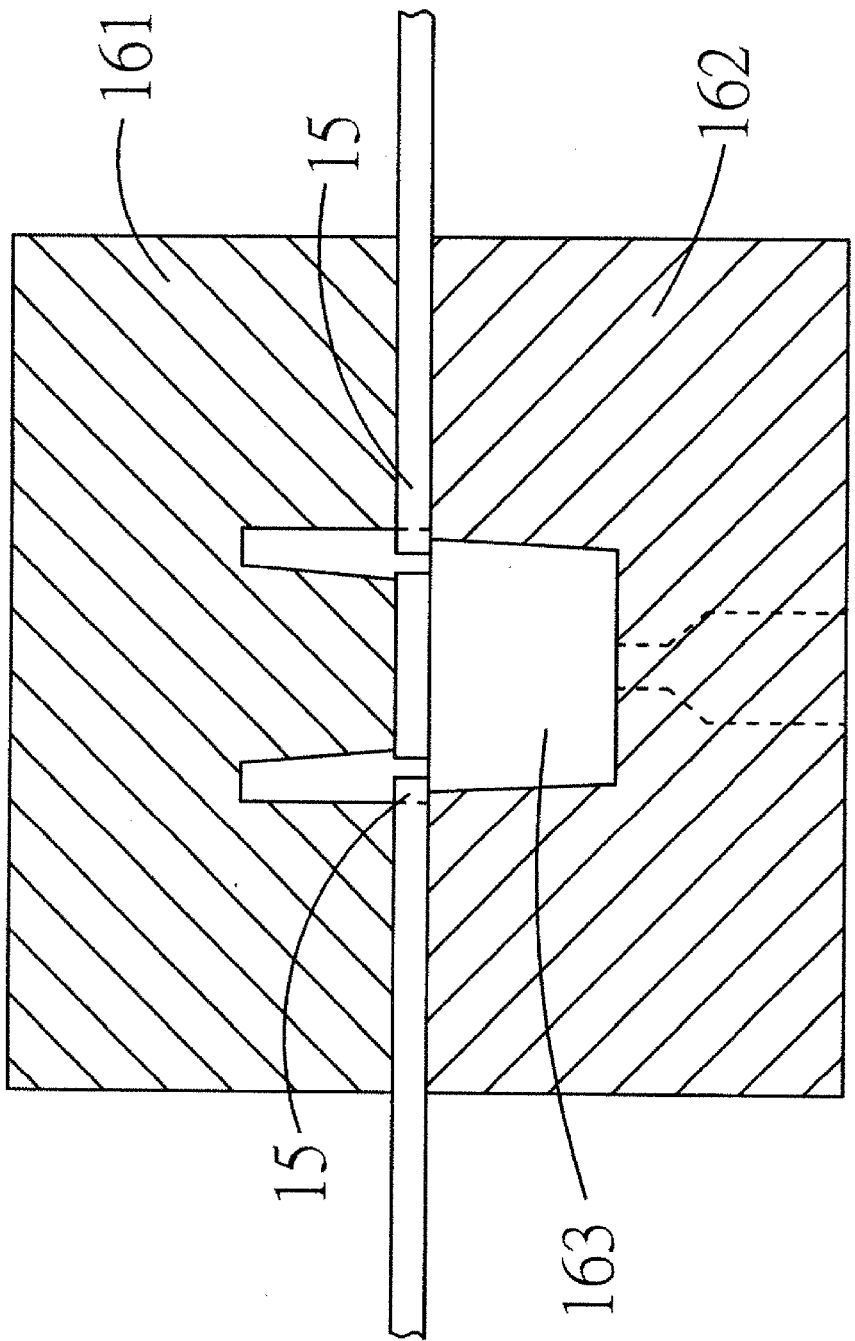
FIG. 4 is a schematic view showing a structure of a forming mold of a conventional light-emitting component.
Figure 5:
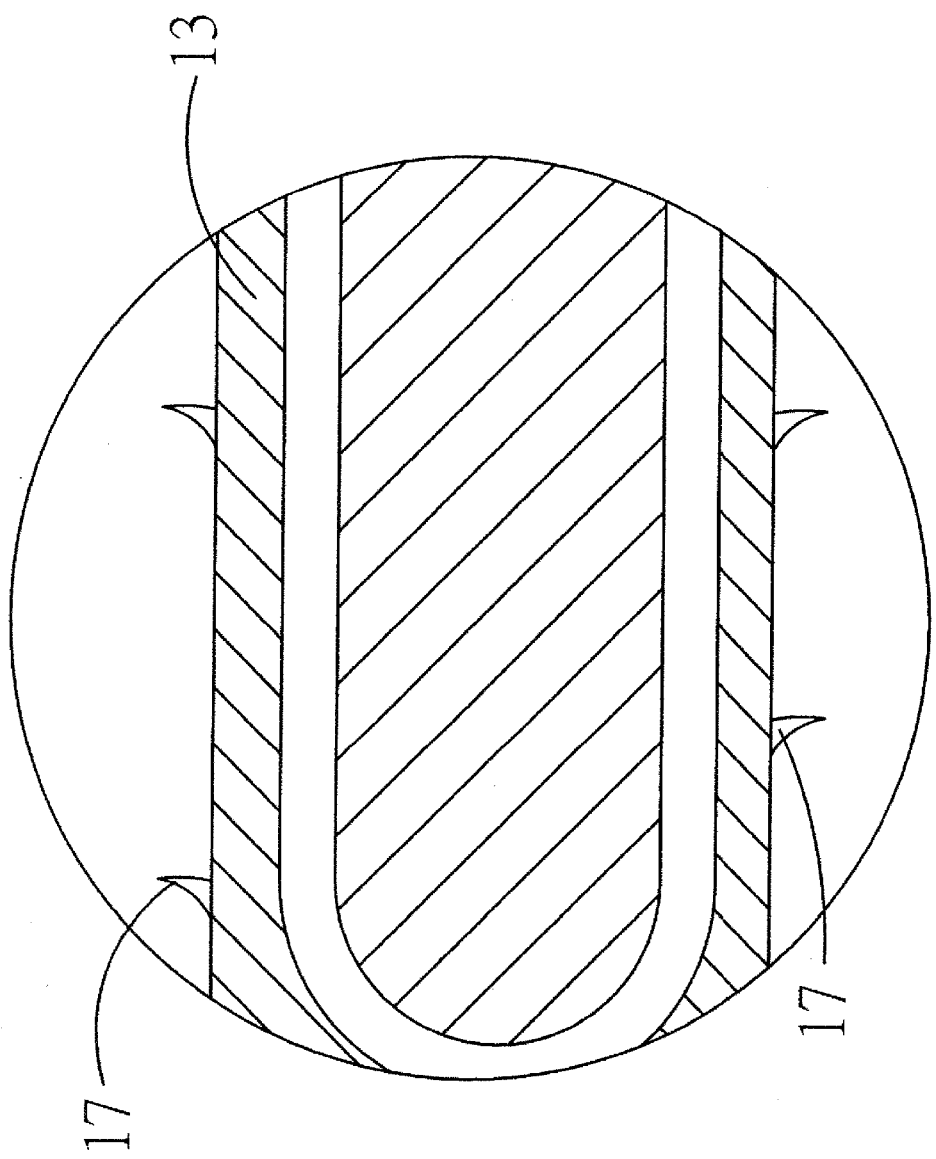
FIG. 5 is an enlarged schematic view showing a structure of some burrs of a conventional light-emitting component.
Figure 6:
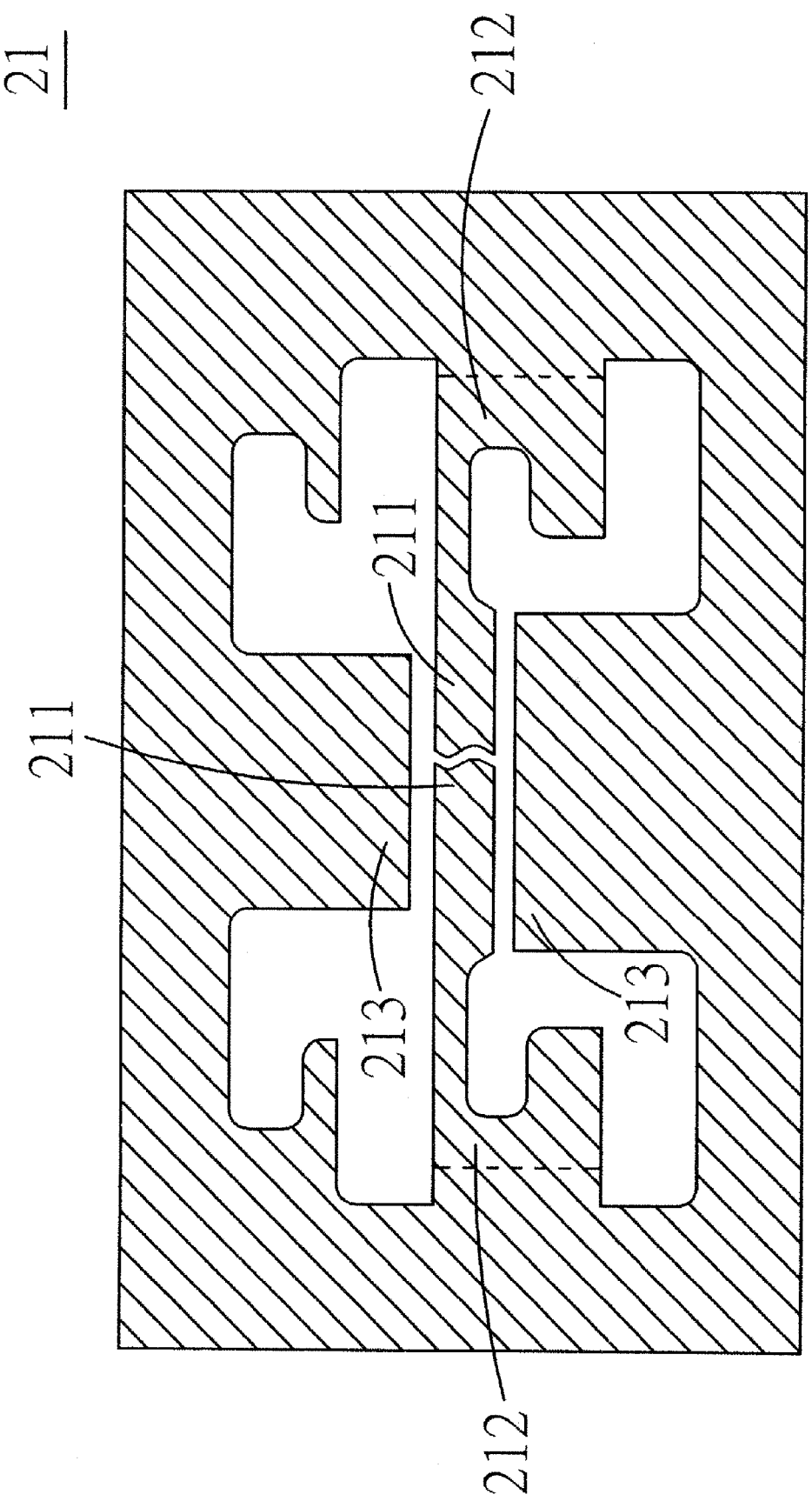
FIG. 6 is a schematic view showing a structure of a frame according to the present invention.
Figure 7:
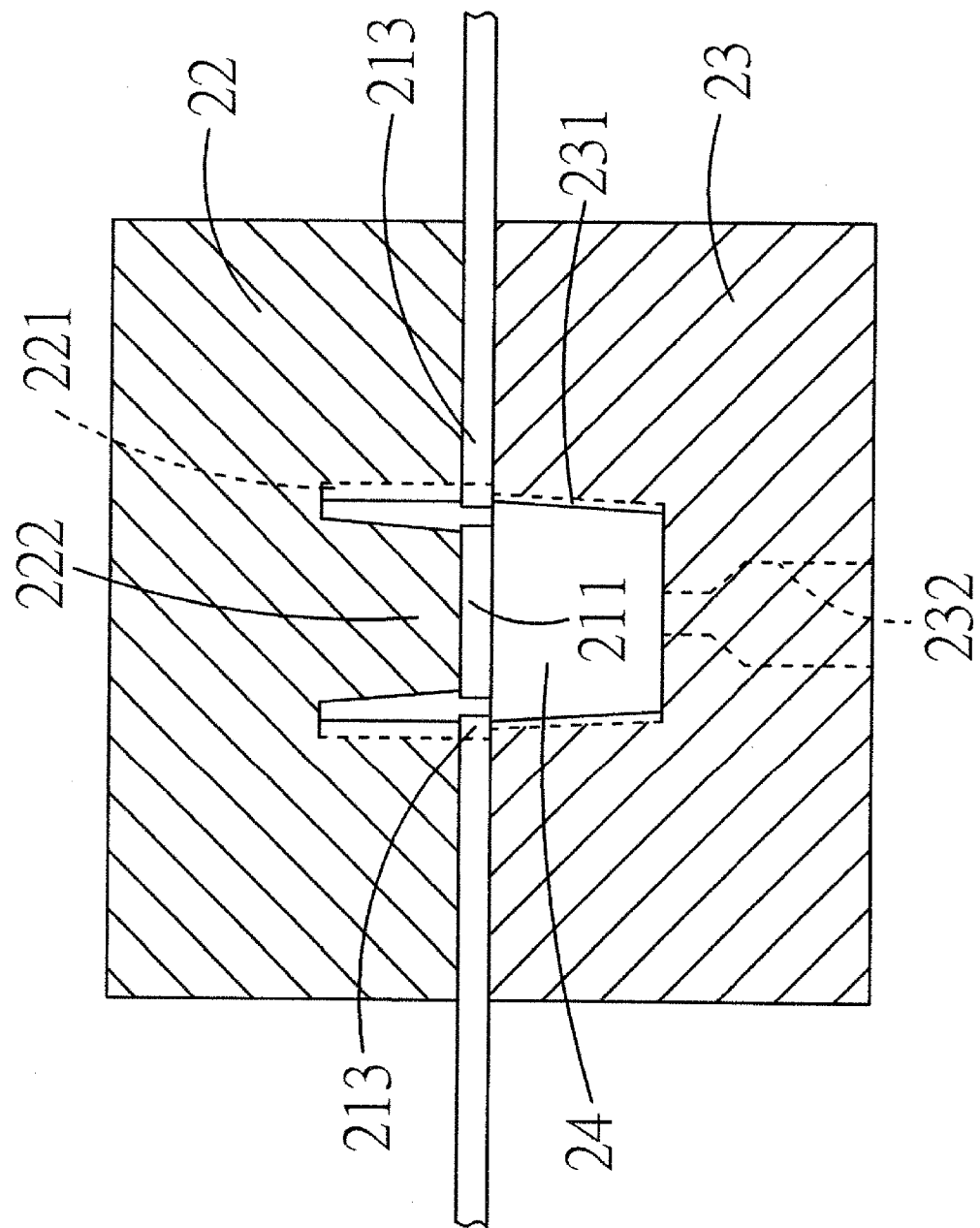
FIG. 7 is a schematic view showing a structure of a forming mold of a light-emitting member according to the present invention.
Figure 8:
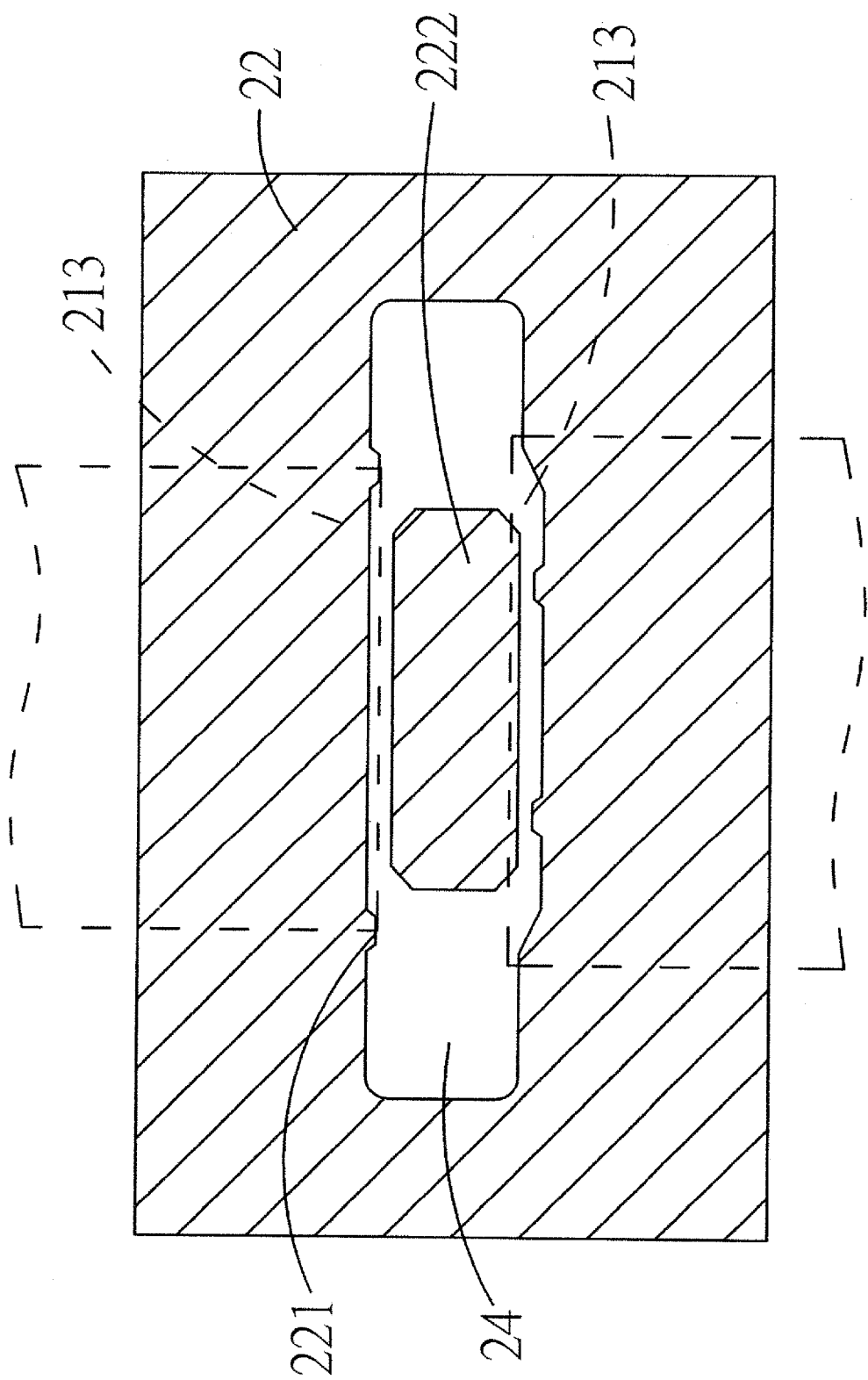
FIG. 8 is a schematic view showing structure of an upper mold according to the present invention.
Figure 9:
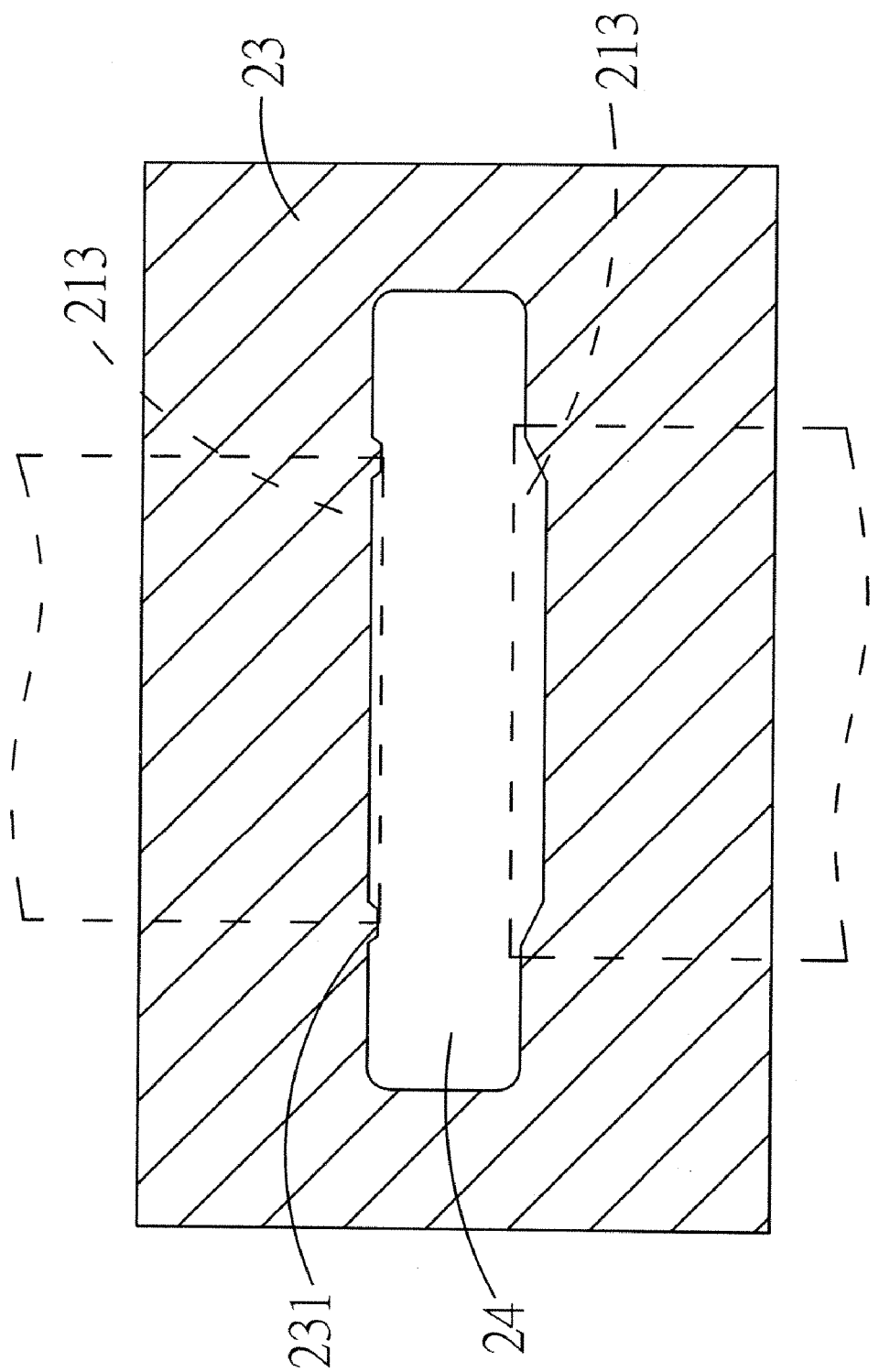
FIG. 9 is a schematic view showing a structure of a lower mold according to the present invention.

A forming mold of a light-emitting member according to the present invention, as illustrated in FIG. 6, at least comprises:

a frame 21 which is provided with two carriers 211 that are not connected with each other, pins 212 that are extended from each of the carriers 211, and supporting portions 213 that are not connected with each of the carriers 211;

an upper mold 22, as illustrated in FIGS. 7 and 8, wherein one or more first projections 221 are disposed at the position where the brinks of the upper mold 22 contact the supporting portions 213, the upper mold 22 is provided with a window-forming portion 222 that penetrates into the carriers 211, and the depth of the first projections 221 is not beyond the range of the window-forming portion 222; and a lower mold 23, wherein the upper and lower molds 22, 23 match with each other to provide a forming space 24 that contains the carriers 211 and a part of the supporting portions 213, one or more second projections 231 are disposed at the position where the brinks of the lower mold 23 contact the supporting portions 213, the depth of the second projections 231 is not beyond the range of the window-forming portion 222, as illustrated in FIGS. 7 and 9, the first projections 221 and the second projections 231 are located on the same plane, and the lower mold 23 is provided with a gate 232 in fluid communication with the forming space 24.

Figure 10:
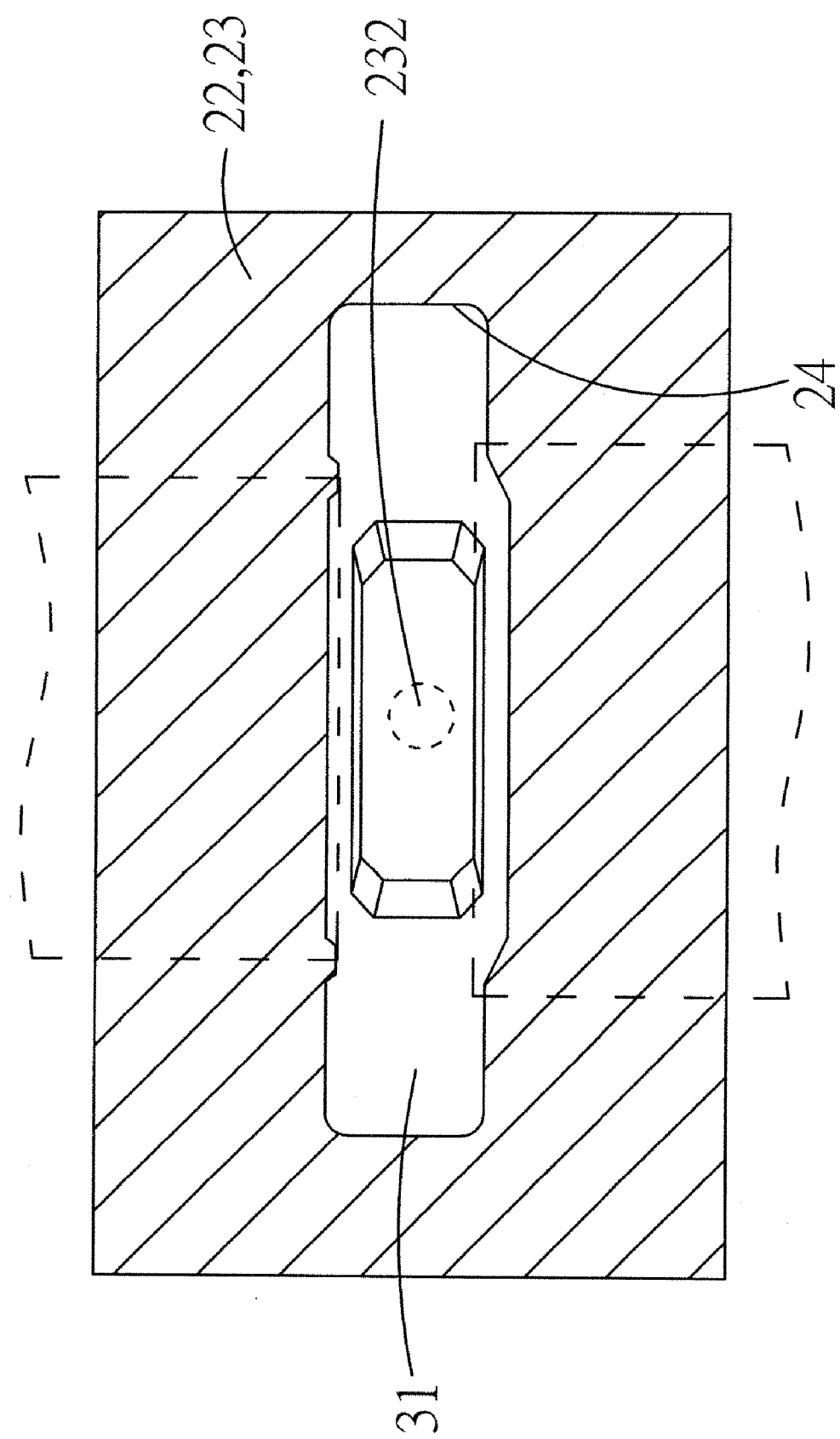
FIG. 10 is a schematic view showing a structure of a base that is formed in a forming space according to the present invention.
Figure 11:
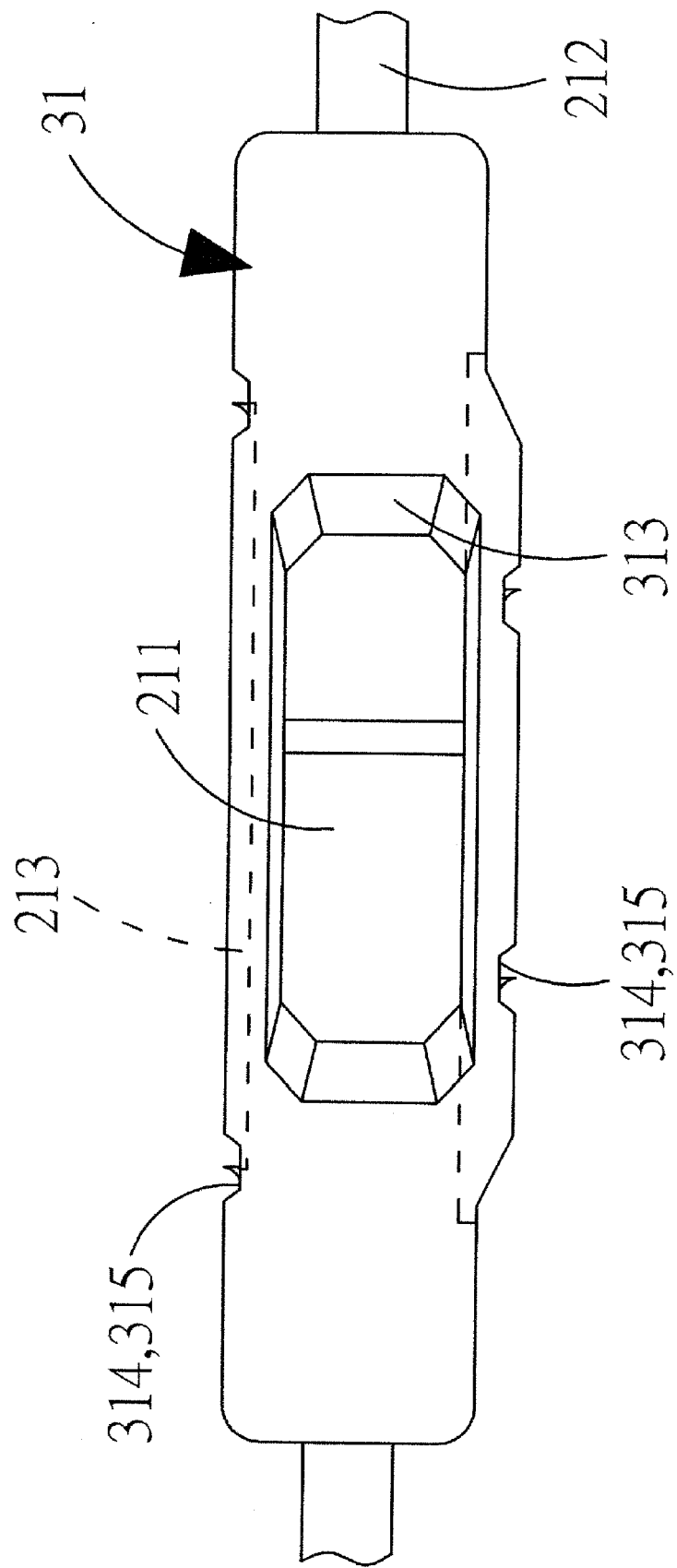
FIG. 11 is a schematic view showing a structure of a light-emitting member according to the present invention.
Figure 12:
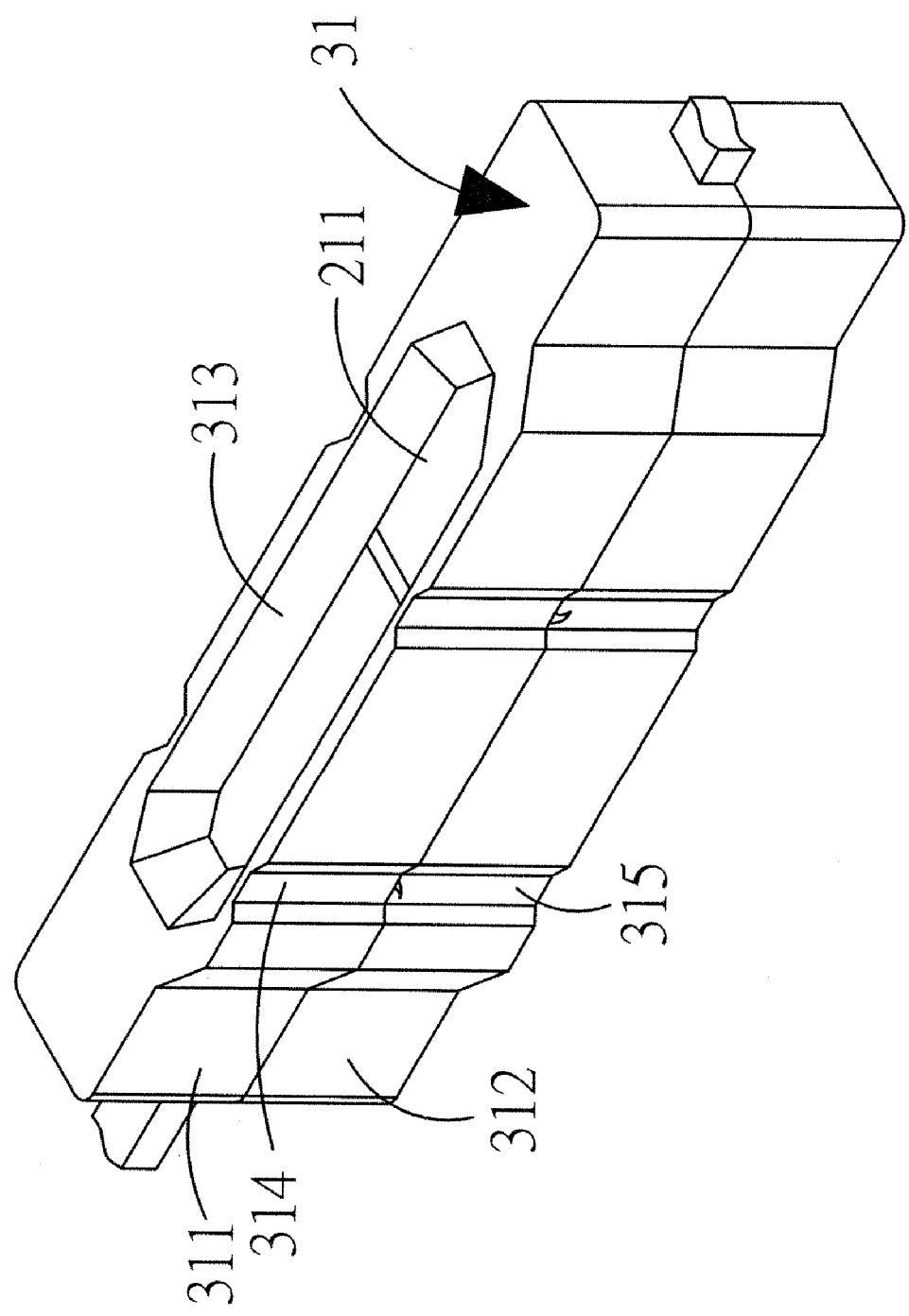
FIG. 12 is a three-dimensional view showing a structure of a light-emitting member according to the present invention.

When injection molding is performed, a plastic material is injected into the gate 232. The forming space 24 is filled up with the plastic material to form the base 31 of the light-emitting member, as illustrated in FIGS. 10 to 12. The base 31 is formed with an upper mold portion 311 and lower mold portion 312 and the base 31 envelops the carriers 211 and a part of the supporting portions 213. Also, the pins 212 are exposed from the base 31, and the upper mold portion 311 of the base is formed thereon with a window 313 to expose the carriers 211. One or more first recesses 314 corresponding to the first projections are disposed at the position where the brinks of the upper mold portion 311 of the base contact the supporting portions 213, one or more second recesses 315 corresponding to the second projections are disposed at the position where the brinks of the lower mold portion 312 of the base contact the supporting portions 213, and the first and second recesses 314, 315 are located on the same plane.

Figure 13:
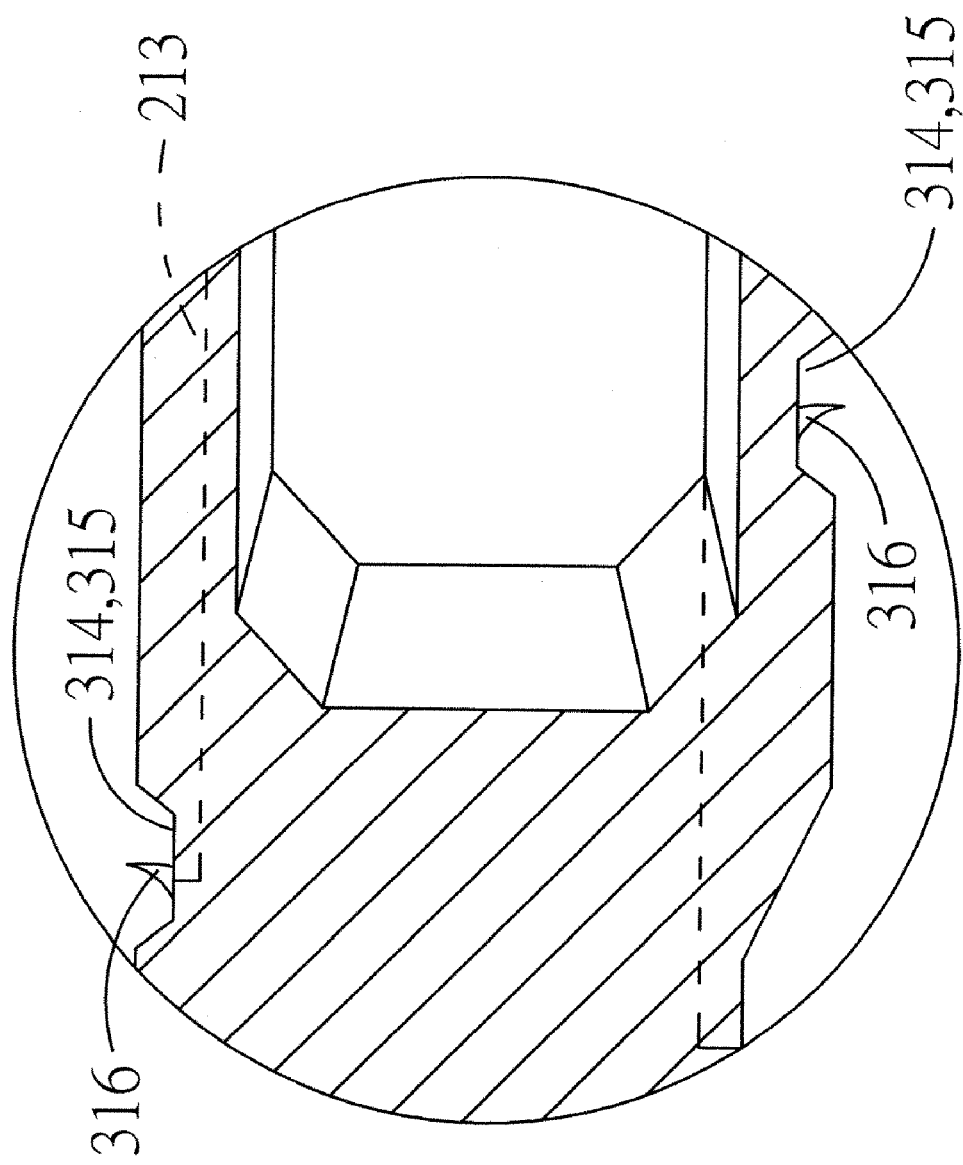
FIG. 13 is an enlarged schematic view showing a structure of recesses and burrs according to the present invention.

When the plastic material is injection molded, the plastic material bleeds along the supporting portions 213 to form burrs 316, as illustrated in both FIGS. 12 and 13, which can be concealed in the recesses 314, 315 that are formed corresponding to each of the projections, thereby reducing the influence of the burrs 316 on the external size of the entire base.

The present invention provides an improved structure of a light-emitting member and its forming mold. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. A light-emitting member at least comprising:
    a frame which is provided with two carriers that are not connected each other, pins that are extended from each of the carriers, and supporting portions that are not connected with each of the carriers; and
    a base which envelops the carriers and a part of the supporting portions and is formed with a window to expose the carriers, one or more recesses being disposed at the position where the brinks of the base contact the supporting portions.

2. The light-emitting member in accordance with claim 1, wherein the recessed depth of the recesses is not beyond the range of the window.

3. The light-emitting member in accordance with claim 1, wherein the base is provided with an upper mold portion and a lower mold portion.

4. The light-emitting member in accordance with claim 3, wherein the window is disposed on the upper mold portion.

5. The light-emitting member in accordance with claim 3, wherein the upper mold portion is provided with a first recess, the lower mold portion is provided with a second recess, and the first and second recesses are located on the same plane.

6. The light-emitting member in accordance with claim 3, wherein the upper and lower mold portions are injection molded by upper and lower molds.

7. The light-emitting member in accordance with claim 6, wherein the upper and lower molds match with each other to provide a forming space with a shape corresponding to that of the base, and the lower mold is provided with a gate in fluid communication with the forming space.

8. The light-emitting member in accordance with claim 7, wherein the upper and lower molds are provided at the position where the brinks of the forming space contact the supporting portions with corresponding to the recesses.

9. The light-emitting member and its forming mold in accordance with claim 8, wherein the projections of the upper and lower molds are located on the same plane.

10. A forming mold of a light-emitting member at least comprising:
    a frame which is provided with two carriers that are not connected with each other, pins that are extended from each of the carriers, and supporting portions that are not connected with each of the carriers; and
    an upper mold and a lower mold which match with each other to provide a forming space that contains the carriers and a part of the supporting portions, one or more recesses being disposed at the position where the brinks of the upper and lower molds contact the supporting portions.

11. The forming mold of a light-emitting member in accordance with claim 10, wherein the upper mold is provided with a window-forming portion that penetrates into the carriers.

12. The forming mold of a light-emitting member in accordance with claim 11, wherein the depth of the projections is not beyond the range of the window-forming portion.

13. The forming mold of a light-emitting member in accordance with claim 10, wherein the projections of the upper and lower molds are located on the same plane.

14. The forming mold of a light-emitting member in accordance with claim 10, wherein the lower mold is provided with a gate in fluid communication with the forming space.

15. The forming mold of a light-emitting member in accordance with claim 10, wherein the base of the light-emitting member is formed in the forming space after injection molding.

16. The forming mold of a light-emitting member in accordance with claim 15, wherein recesses corresponding to the projections are disposed at the position where the brinks of the base contact the supporting portions.

* * * * *